United States Patent
Agostini et al.

(10) Patent No.: US 10,517,195 B2
(45) Date of Patent: Dec. 24, 2019

(54) HEAT EXCHANGER ASSEMBLY AND METHOD FOR OPERATING A HEAT EXCHANGER ASSEMBLY

(71) Applicant: ABB Schweiz AG, Baden (CH)

(72) Inventors: Francesco Agostini, Zürich (CH); Daniele Torresin, Birmenstrorf (CH); Mathieu Habert, Rixheim (CH); Bruno Agostini, Zürich (CH)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 16/113,341

(22) Filed: Aug. 27, 2018

(65) Prior Publication Data

US 2018/0368292 A1 Dec. 20, 2018

Related U.S. Application Data

(63) Continuation of application No. PCT/EP2017/054338, filed on Feb. 24, 2017.

(30) Foreign Application Priority Data

Feb. 25, 2016 (EP) .................................... 16157272

(51) Int. Cl.
*H05K 7/20* (2006.01)
*H01L 23/427* (2006.01)
*F28F 27/02* (2006.01)

(52) U.S. Cl.
CPC ......... *H05K 7/20936* (2013.01); *F28F 27/02* (2013.01); *H01L 23/427* (2013.01);
(Continued)

(58) Field of Classification Search
CPC ........... H01L 2924/0002; H01L 23/427; F25B 2400/0409; F25B 25/005;
(Continued)

(56) References Cited

U.S. PATENT DOCUMENTS 6,427,460 B1 * 8/2002 Zanon .................... F25B 41/00
62/174
6,862,894 B1    3/2005 Miles, Sr.
(Continued)

FOREIGN PATENT DOCUMENTS

DE    202012008740 U1    12/2013

OTHER PUBLICATIONS

European Patent Office, International Search Report & Written Opinion issued in corresponding Application No. PCT/EP2017/054338, dated Jul. 12, 2017, 13 pp.
(Continued)

*Primary Examiner* — Mandeep S Buttar
(74) *Attorney, Agent, or Firm* — Taft Stettinius & Hollister LLP; J. Bruce Schlekopf

(57) ABSTRACT

A heat exchanger assembly is disclosed. The heat exchanger assembly comprises at least one passive cooling circuit, the passive cooling circuit including an evaporator connectable to a device to be cooled for conducting heat from the device to be cooled to the cooling fluid within the evaporator, thereby evaporating the cooling fluid, and a condenser interconnected with the evaporator for receiving the evaporated cooling fluid from the evaporator, releasing heat from the cooling fluid to an environment of the condenser, thereby condensing the cooling fluid, and for returning the condensed cooling fluid to the evaporator; and an active partial circuit comprising a compressor and an auxiliary condenser, the active partial circuit being activatable and deactivatable and being connected to the passive cooling circuit for receiving, in an activated state of the active partial circuit, the cooling fluid from the evaporator, for compressing the received cooling fluid by the compressor, for releasing heat, by the auxiliary condenser, from the compressed cooling fluid to an environment of the auxiliary condenser, and for
(Continued)

returning the condensed cooling fluid to the evaporator. Furthermore, the passive cooling circuit is a base-to-air type thermosiphon or an air-to-air type thermosiphon.

21 Claims, 5 Drawing Sheets

(52) U.S. Cl.
CPC ..... *H05K 7/20309* (2013.01); *H05K 7/20318* (2013.01); *H05K 7/20327* (2013.01); *H05K 7/20354* (2013.01); *H05K 7/20381* (2013.01)

(58) Field of Classification Search
CPC ............ F25B 2700/21163; F25B 41/04; F25B 2339/041; F25B 2600/2513; F25B 2700/21161; F25B 30/02; F25B 40/04; F25B 49/02; F25B 49/022; F25B 2400/0411; F25B 2400/061; F25B 2600/111; F25B 40/00; F25B 2400/0403; F25B 2313/02732; F25B 39/00; F25B 39/02; F25B 41/062; F28D 15/0266; H05K 7/20309; H05K 7/20318; H05K 7/20327; H05K 7/20354; H05K 7/20381; H05K 7/20936; H05K 7/20827; H05K 7/20836; H05K 7/2029; H05K 7/20663; F28F 27/02; F24F 11/46; F24F 1/022; F24F 5/0035; F24F 11/84; F24F 11/85; G06F 2200/201; G06F 1/20; G06F 1/206
USPC ............ 165/104.25, 104.27; 361/700; 62/79, 62/498, 115, 222, 228.1, 119
See application file for complete search history.

(56) References Cited

U.S. PATENT DOCUMENTS

| | | | |
|---|---|---|---|
| 9,398,731 B1 * | 7/2016 | Imwalle | H05K 7/20781 |
| 10,101,060 B2 * | 10/2018 | Feng | F25B 6/04 |
| 2015/0184949 A1 | 7/2015 | So et al. | |
| 2017/0211851 A1 * | 7/2017 | Feng | F25B 6/04 |

OTHER PUBLICATIONS

European Patent Office, Search Report issued in corresponding Application No. 16157272.2, completed Aug. 19, 2016, 6 pp.

* cited by examiner

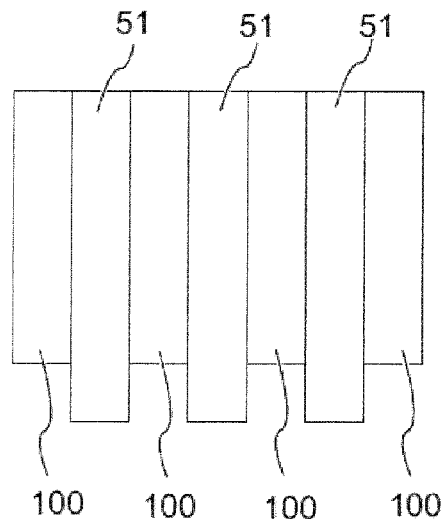
Fig. 8
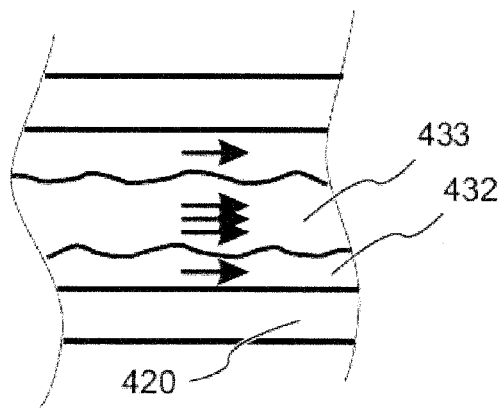 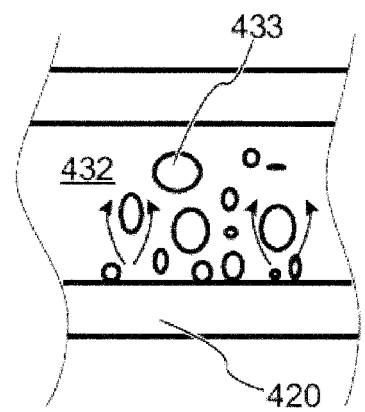
Fig. 9　　　　Fig. 10

HEAT EXCHANGER ASSEMBLY AND METHOD FOR OPERATING A HEAT EXCHANGER ASSEMBLY

TECHNICAL FIELD

The disclosure relates generally to a heat exchanger assembly. Particular embodiments relate to a power electronic unit comprising at least one power electronic component and at least a heat exchanger assembly as disclosed herein. Further embodiments relate to the use of a heat exchanger assembly in cooling an electric component. Moreover, the disclosure relates to a method for operating a heat exchanger assembly.

BACKGROUND ART

In cooling applications, particularly for cooling electric components such as power electronic components, heat exchangers are commonly employed. The heat exchangers constitute at least a part of a cooling means for removing the heat which is dissipated from the component to be cooled, i. e. a process, in which heat is transferred from a location A (the component to be cooled) to a location B (the destination of the removed heat). In particular, the destination of the removed heat involves a heat discharge to the environment.

Conventional heat exchangers may comprise an evaporator for evaporating a coolant medium (a cooling fluid), a condenser for converting the aggregation state of a vaporized coolant medium back to its liquid form, and a compressor for conveying and compressing the coolant medium. While such a refrigeration system often allows for an effective cooling, it is energivorous.

Other types of conventional heat exchangers may comprise a so-called thermosiphon. A thermosiphon performs heat exchange based on natural circulation without the need of a compressor. Thermosiphons are less energivorous than active refrigeration systems using e. g. a compressor and/or a pump, but they are only capable of cooling in relatively limited environmental conditions.

U.S. Pat. No. 6,862,894 B1 discloses a heat exchanger comprising a refrigeration system and a water-cooled auxiliary condenser device.

BRIEF SUMMARY OF THE INVENTION

In view of the above, a heat exchanging assembly according to claim 1, a use of a heat exchanging assembly according to claim 9, a power electronic unit according to claim 10 comprising a heat exchanging assembly, and a method for operating a heat exchanger assembly are provided. Further aspects, advantages, and features of the present disclosure are apparent from the dependent claims, the description, and the accompanying drawings.

According to one aspect of the disclosure, a heat exchanger assembly is provided. The heat exchanger assembly comprises at least one passive cooling circuit, the passive cooling circuit comprising an evaporator connectable to a device to be cooled for conducting heat from the device to be cooled to the cooling fluid within the evaporator, thereby evaporating the cooling fluid, and a condenser interconnected with the evaporator for receiving the evaporated cooling fluid from the evaporator, releasing heat from the cooling fluid to an environment of the condenser, thereby condensing the cooling fluid, and for returning the condensed cooling fluid to the evaporator. The heat exchanger assembly further comprises an active partial circuit comprising a compressor and an auxiliary condenser, the active partial circuit being activatable and deactivatable and being connected to the passive cooling circuit for receiving, in an activated state of the active partial circuit, the cooling fluid from the evaporator, for compressing the received cooling fluid by the compressor, for releasing heat, by the auxiliary condenser, from the compressed cooling fluid to an environment of the auxiliary condenser, and for returning the condensed cooling fluid to the evaporator. Furthermore, the passive cooling circuit is a base-to-air type thermosiphon or an air-to-air type thermosiphon.

According to a further aspect of the disclosure, the use of a heat exchanger assembly as disclosed herein is provided. According to the use, the heat exchanger assembly is used in cooling an electrical component. The electrical component may include an active electrical component and/or a passive electrical component. The electrical component comprises in particular one or more of a power electronic component, an electrical cabinet, an electrical or electronic device, a capacitor, and a magnetic device.

According to yet a further aspect of the disclosure, a power electronic unit comprising at least one power electronic component and at least one heat exchanger assembly as disclosed herein is provided.

According to yet a further aspect of the disclosure, a method for operating a heat exchanger assembly is provided. In the method, typically, the heat exchanger assembly is according to any of the embodiments disclosed herein.

According to an aspect of the disclosure, in the method, the heat exchanger assembly comprises at least one passive cooling circuit, the passive cooling circuit comprising an evaporator connectable to a device to be cooled for conducting heat from the device to be cooled to the cooling fluid within the evaporator, thereby evaporating the cooling fluid, and a condenser interconnected with the evaporator for receiving the evaporated cooling fluid from the evaporator, releasing heat from the cooling fluid to an environment of the condenser, thereby condensing the cooling fluid, and for returning the condensed cooling fluid to the evaporator, and an active partial circuit comprising a compressor and an auxiliary condenser, the active partial circuit being activatable and deactivatable and being connected to the passive cooling circuit for receiving, in an activated state of the active partial circuit, the cooling fluid from the evaporator, for compressing the received cooling fluid by the compressor, for releasing heat, by the auxiliary condenser, from the compressed cooling fluid to an environment of the auxiliary condenser, and for returning the condensed cooling fluid to the evaporator.

The method comprises: according to an operating condition of the heat exchanger assembly, deactivating the active partial circuit such that it operates in a passive cooling mode, in which the heat exchanger assembly performs passive cooling by the evaporator and the condenser of the heat exchanging device; and according to the operating condition of the heat exchanger assembly, activating the active partial circuit such that it operates in a compression cycle cooling mode, in which the heat exchanger assembly performs a forced convection by the evaporator of the passive cooling circuit, the auxiliary condenser of the active partial circuit and the compressor of the active partial circuit.

The heat exchanger assembly according to embodiments described herein enables an operation with at least two operation modes. In one of the operation modes, the at least one passive cooling circuit operates in a standalone manner. In another one of the operation modes, the active partial circuit operates while using at least parts of the at least one passive cooling circuit for a refrigeration cycle. Thus, the heat exchanger assembly can be operated such that a comparatively low amount of energy is consumed when the environmental conditions are convenient for passive operation. When the environmental conditions become unfavorable, the heat exchanger assembly can continue to operate without e. g. a de-rating of the passive cooling circuit. Also, the amount of space needed for the heat exchanger assembly is reduced, for example compared with the conventional solutions.

With the heat exchanger assembly according to embodiments described herein, several effects can be obtained which allow for an energy-efficient use of the heat exchanger assembly under varying environmental conditions, in particular in a system for cooling an electrical or electronic component.

BRIEF DESCRIPTION OF THE DRAWINGS

The subject matter of the disclosure will be explained in more detail with reference to preferred exemplary embodiments which are illustrated in the accompanying drawings.

In the drawings:

FIG. 8 shows passive cooling circuits of a heat exchanger assembly stacked in alternation with power electronic components, according to yet a further embodiment of the present disclosure;

FIG. 9 shows a schematic view of a convection boiling situation in a passive cooling circuit; and FIG. 10 shows a schematic view of a pool boiling situation in a passive cooling circuit.

DETAILED DESCRIPTION OF THE EMBODIMENTS

Figure 1:
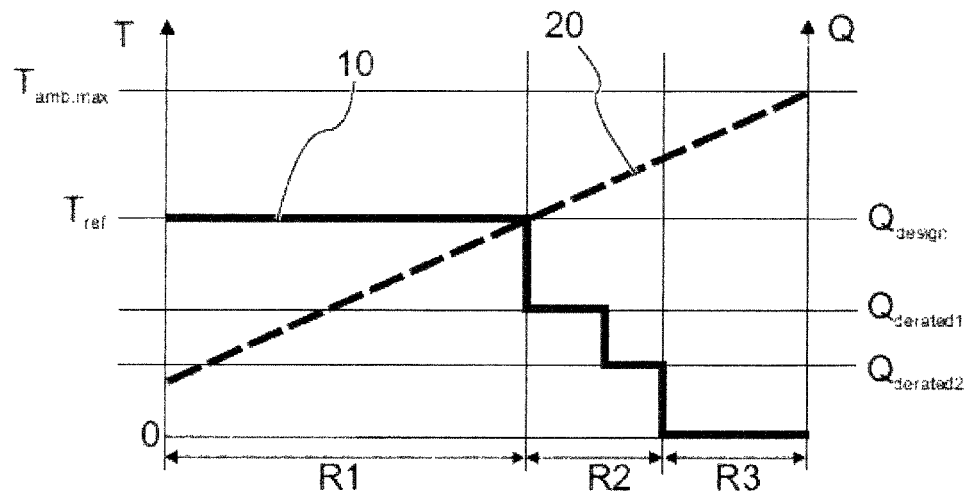
FIG. 1 shows a diagram of ambient temperature and operating power of an electronic component which is cooled by a prior-art cooling device.

In the following, various aspects and features of embodiments of the disclosure are described. It is intended that each of the aspects and features, whether described in the context of a particular embodiment or not, can be combined with any other aspect or feature.

In the drawings and the description of the embodiments, in principle, identical or corresponding parts are provided with the same reference numerals. The description relating to the same reference numerals shall be applicable to any embodiment unless otherwise specified.

FIG. 1 shows a diagram of ambient temperature and operating power of an electronic component which is cooled by a prior-art cooling device. In this cooling device, a passive cooling circuit is used, such as a thermosiphon.

On the horizontal axis of the diagram, operating ranges R1, R2 and R3 are shown, while on the vertical axis, the ambient temperature T around the electronic component and the operating power Q of the electronic component are depicted. The electronic component may be, for example, a power electronic device such as a power MOSFET or a power IGBT device or a power IGCT device.

The temperature range for the exemplary evaluation of the prior-art cooling device is schematically shown by a temperature curve 20. $T_{amb.max}$ denotes the maximum ambient temperature which is assumed, while $T_{ref}$ denotes a reference ambient temperature, for example a design temperature, for the operation of the electronic component. The reference ambient temperature $T_{ref}$ assumed in this example is 40° C., but this value is not intended to be limiting in any way.

In the diagram of FIG. 1, the operating power Q of the electronic component is schematically shown by a power curve 10. Here, $Q_{design}$ denotes the design power of the electronic component. As can be seen from FIG. 1, in operating range R1 which reaches up to the reference temperature, the electronic component can be operated at the design power. In this range R1, the cooling capacity of the thermosiphon is sufficient to cool the electronic component.

When the reference ambient temperature is exceeded, the cooling capacity of the thermosiphon does not suffice any more when the electronic component continues operation at design power. In order to avoid a deterioration or a damage to the electronic component, a common way is to limit the operating power of the electronic component to a value lower than its design power, i. e. to perform a de-rating. As shown in FIG. 1, this de-rating may be performed in steps of a first de-rated power $Q_{derated1}$ and a second de-rated power $Q_{derated2}$ lower than $Q_{derated1}$ (operating range R2). Once a certain threshold ambient temperature is exceeded, the operating power of the electronic component has to be limited to 0, i. e. the operation of the electronic component has to be stopped (operating range R3).

Figure 2:
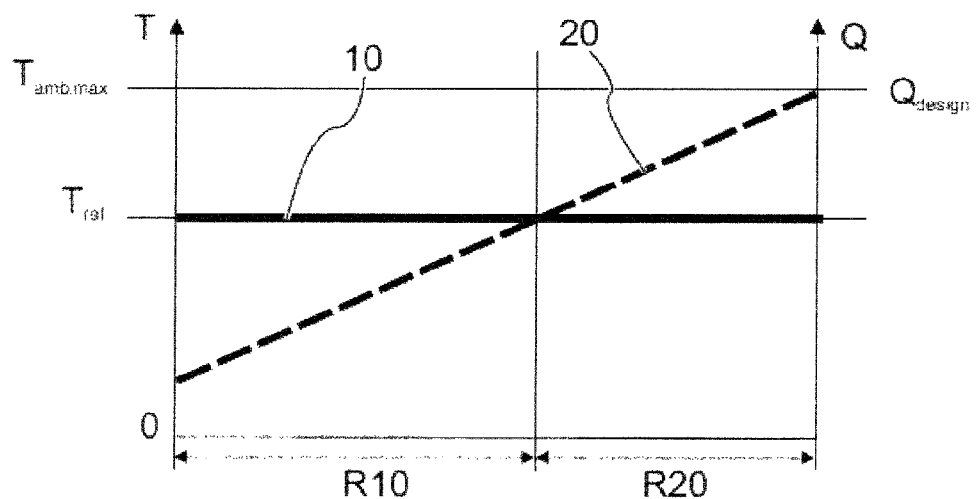
FIG. 2 shows a diagram of ambient temperature and operating power of an electronic component which is cooled by a cooling device employing a heat exchanger assembly according to an embodiment of the present disclosure.

FIG. 2 shows a diagram of ambient temperature and operating power of an electronic component which is cooled by a cooling device employing a heat exchanger assembly according to an embodiment of the present disclosure. The diagram of FIG. 2 is similar to the one shown in FIG. 1 in that the temperature curve 20 up to the maximal ambient temperature $T_{amb.max}$ is the same. In contrast to the prior-art cooling device which leads to a diagram similar to FIG. 1, when employing a heat exchanger assembly according to an embodiment of the present disclosure, an active partial circuit is activatable and deactivatable an adapted to work in connection with the passive cooling circuit, for example in connection with a thermosiphon used as the passive cooling circuit.

Thereby, a sufficient cooling capacity up to the maximum ambient temperature can be secured. As can be seen in FIG. 2, a de-rating of the operating power of the electronic component can be avoided.

Figure 3:
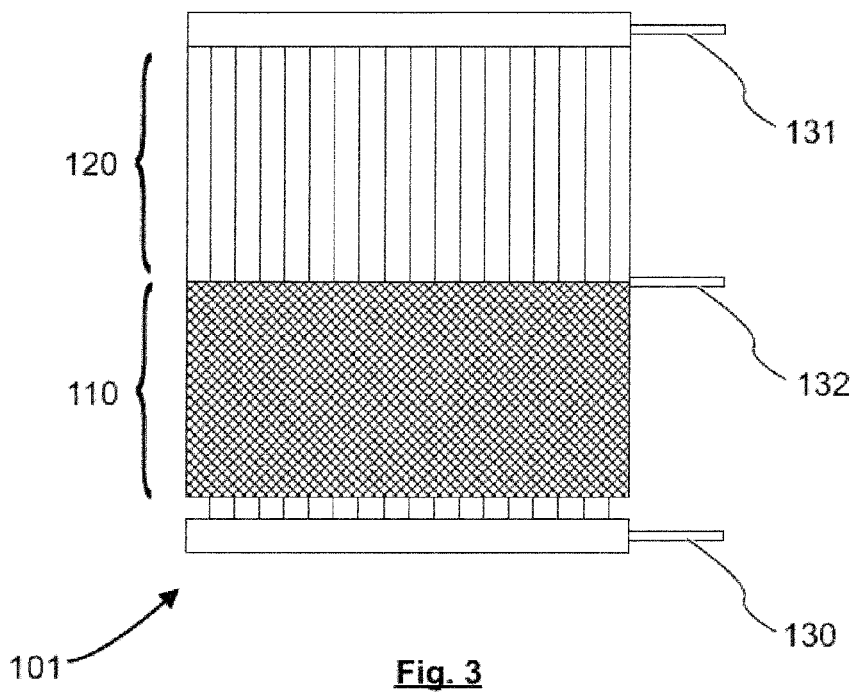
FIG. 3 shows a schematic side view of a base-to-air type thermosiphon which is used in certain embodiments disclosed herein.

FIG. 3 is a schematic side view of a base-to-air type thermosiphon. The base-to-air thermosiphon can be used as at least part of a passive cooling circuit 100 in some of the embodiments described herein. It is to be understood, however, that a passive cooling circuit 100 according to embodiments of this disclosure is not limited to a base-to-air type thermosiphon of FIG. 3.

As depicted in FIG. 3, the base-to-air thermosiphon comprises an inlet 130 for receiving a cooling fluid generally in liquid state. The inlet 130 is disposed such that the cooling fluid is passed into an evaporator 110, which forms the lower part of the base-to-air thermosiphon in FIG. 3. In the evaporator, the cooling fluid is transferred to its vaporized state. The base-to-air thermosiphon further comprises a condenser 120, which forms the upper part of the base-to-air thermosiphon in FIG. 3. The condenser 120 serves for condensing the vaporized cooling fluid back to its liquid form.

In the exemplary embodiment, a condenser outlet 131 is disposed at the uppermost part of the condenser 120, i. e. in an upstream area of the condenser 120 with respect to the general streaming direction of the cooling fluid within the thermosiphon. From the condenser outlet 131, the cooling fluid, which is at least partially condensed such that is at least partially in generally liquid state, can be discharged.

In certain embodiments, additionally or alternatively to the condenser outlet 131, an evaporator outlet 132 is provided. The evaporator outlet 132 is located in the area of the evaporator 110 with respect to the general streaming direction of the cooling fluid within the thermosiphon. Typically, the evaporator outlet 132 is located in an upstream area of the evaporator 110 with respect to the general streaming direction of the cooling fluid within the thermosiphon, for example at the uppermost part of the evaporator 110.

Both for a condenser outlet 131 and an evaporator outlet 132, the cooling fluid which enters the thermosiphon serving as a passive cooling circuit 100 as used herein, passes at least a part of the evaporator 110. Thus, for the purpose of this disclosure, a device connected to any one of the condenser outlet 131 or the evaporator outlet 132 will receive, in certain modes of operation, the cooling fluid from the evaporator 110 of the passive cooling circuit 100. In other words: Even if the cooling fluid passes from the inlet 130 to the evaporator 110, from the evaporator 110 to the condenser 120, and from the condenser to the condenser outlet 131, a device connected to the condenser outlet 131 will still receive cooling fluid from the evaporator 110 within the meaning as used herein.

A device to be cooled is typically in thermal contact with, e. g. bonded or affixed to, the evaporator 110 of the base-to-air thermosiphon. In certain embodiments, multiple devices to be cooled may be in thermal contact with different side surfaces of the evaporator 110.

A stream of air may pass through an area of the condenser 120 of the base-to-air thermosiphon. Typically, a stream of forced convection air will remove the heat from the area.

Figure 4:
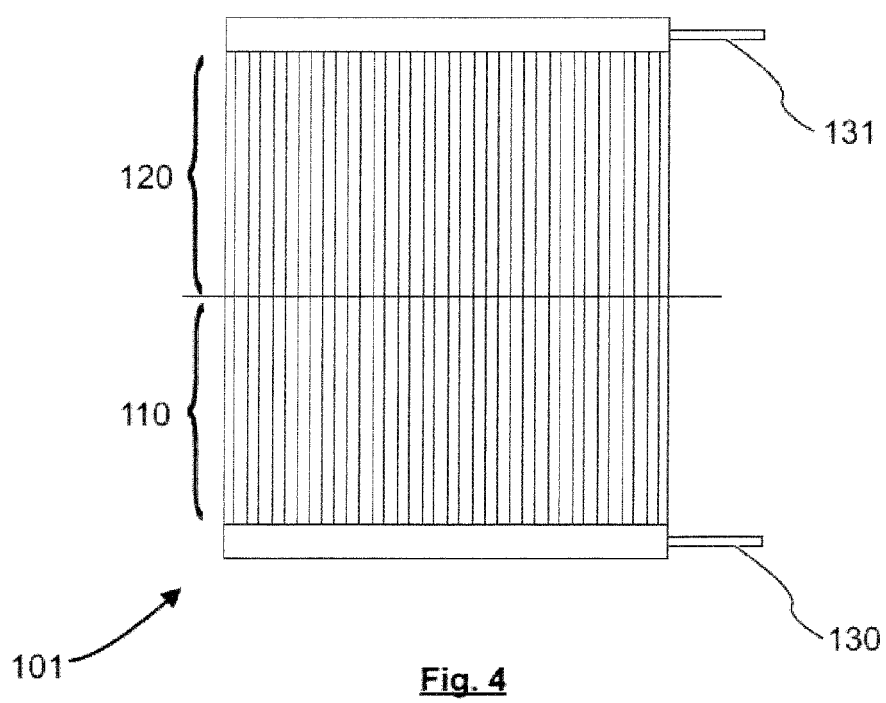
FIG. 4 shows a schematic side view of an air-to-air type thermosiphon which is used in certain embodiments disclosed herein.

FIG. 4 is a schematic side view of an air-to-air type thermosiphon. As with the base-to-air thermosiphon, the air-to-air thermosiphon of FIG. 4 comprises an evaporator 110 and a condenser 120. Additionally, an inlet 130 and a condenser outlet 131 are provided, comparably to the base-to-air thermosiphon described above with reference to FIG. 3. Here, a stream of air may pass through an area of the evaporator 110 and through an area of the condenser 120 of the air-to-air thermosiphon. Typically, a stream of forced convection air will remove the heat from the area.

The cooling fluid in the embodiments described herein is a cooling medium which is typically a refrigerant fluid having a saturation temperature in a range which occurs at the device 50 to be cooled. Typically, the saturation temperature of the cooling fluid is within the range between about 40° C. and about 100° C., more typically in between about 70° C. and about 90° C., even more typically at about 80° C.

In typical embodiments, a thermosiphon 101 in the passive cooling circuit includes at least one evaporator channel and at least one condenser channel. Typically, the at least one evaporator channel and the at least one condenser channel are in contact with each other such that the cooling fluid can pass through the channels and evaporate and condense in the respective channels. The area of contact between the evaporator channels and the condenser channels is, however, not in all cases a strict boundary between the evaporator 110 and the condenser 120 of the passive cooling circuit 100 as disclosed herein. The exact place of evaporation and condensation typically depends on the temperature, the cooling medium used, the channel geometry and the like. Hence, some evaporation may take place also in the condenser channels, and some condensation may occur in the evaporation channels. Also, in the condenser, and even at the most upstream portion of the condenser, the cooling fluid may not be in an entirely liquid state, but possibly include some vapor fraction as well. In a similar manner, in the evaporator 110, the cooling fluid may also contain some vapor fraction even at the most downstream portion (e. g., the inlet 130) of the evaporator 110.

In typical embodiments described herein, the passive cooling circuit 100 typically comprises a thermosiphon 101 of the kind described with reference to FIGS. 3 and 4. However, the passive cooling circuit 100 is not limited to thermosiphons, and another type of two-phase heat exchanger devices can be used in a passive cooling circuit 100.

Figure 5:
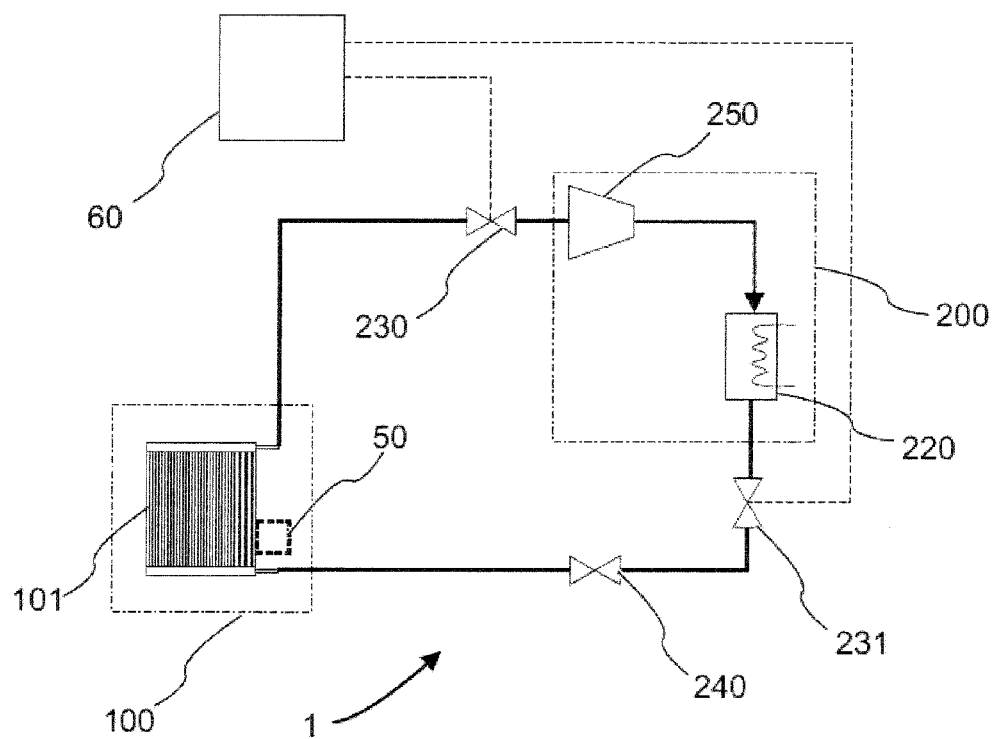
FIG. 5 shows a block diagram of a heat exchanger assembly according to an embodiment of the present disclosure.

FIG. 5 is a block diagram of a heat exchanger assembly 1 according to an embodiment of the present disclosure.

By means of example and not for limitation, in the embodiment of FIG. 5, a thermosiphon 101 forms a passive cooling circuit 100, which is schematically depicted by a dash-dot-lined area. The thermosiphon 101 may, for example, be one of a base-to-air thermosiphon, e. g. as described above in connection with FIG. 3, and an air-to-air thermosiphon, e. g. as described above in connection with FIG. 4.

A device 50 to be cooled is schematically shown with broken lines in FIG. 5. The device 50 to be cooled is arranged with respect to the at least a part of the passive cooling circuit 100 such that heat produced by the device 50 to be cooled can be removed when the heat exchanger assembly is in operation. For example, when a base-to-air thermosiphon is employed in the passive cooling circuit, the device 50 to be cooled is in thermal contact with the evaporator 110 of the base-to-air thermosiphon.

An outlet (not shown in FIG. 5) of the passive cooling circuit 100, e. g. the condenser outlet 131 or the evaporator outlet of any one of the thermosiphons described herein, is connected to the inlet of a first activation means 230.

The first activation means 230 is controllable such that a fluid path between its inlet and its outlet is opened or closed according to a control input. For example, the first activation means 230 is at least one of a mechanically operable valve, an electrically operable valve, and a thermally operable valve such as a thermostatic valve. Typically, an electrically operable valve, such as a electro-mechanical valve, is used as the first activation means 230 in a control process for operating the heat exchanger assembly.

The outlet of the activation means 230 is connected to an inlet of an active partial circuit 200, which is schematically depicted by a dash-dot-lined area. In the embodiment of FIG. 5, the active partial circuit 200 comprises, in the following order with respect to the flow direction of the cooling fluid when the active partial circuit 200 is in its activated state, a compressor 250 and an auxiliary condenser 220. Hence, an inlet of the compressor 250 is connected to the outlet of the activation means 230, an outlet of the compressor 250 is connected to the auxiliary condenser 220, and an outlet of the auxiliary condenser 220 serves as the outlet of the active partial circuit.

The outlet of the active partial circuit is connected to a second activation means 231. In the embodiment shown in FIG. 5, the first and the second activation means 230, 231 together serve as the activation means within the meaning as used herein. Hence, the activation means according to this embodiment comprises two parts. However, in certain embodiments, it may be sufficient to provide a one-part activation means, or a plurality of more than two parts may serve as the activation means.

As the first activation means 230, also the second activation means 231 is controllable such that a fluid path between its inlet and its outlet is opened or closed according to a control input. For example, the second activation means 231 is at least one of a mechanically operable valve, an electrically operable valve, and a thermally operable valve such as a thermostatic valve. Typically, an electrically operable valve, such as a electro-mechanical valve, is used as the second activation means 231 in a control process for operating the heat exchanger assembly.

Hence, in the embodiment depicted in FIG. 5, the outlet of the auxiliary condenser 220 is connected to the inlet of the second activation means 231.

The outlet of the second activation means 231 in the embodiment of FIG. 5 is connected to an inlet of an expansion valve 240. However, in certain embodiments, no expansion valve 240 or a different kind of thermal expansion device may be employed.

The expansion valve 240 in the present embodiment reduces the pressure of the cooling fluid such that it may pass further in a mostly liquid state.

The outlet of the expansion valve 240 is, again, connected to the inlet of the passive cooling circuit 100. Hence, in the embodiment shown in FIG. 5, it is connected to the inlet of the thermosiphon 101.

The connection lines between the described parts are all suitable for transporting the cooling fluid within the circuit(s), i. e. for transporting an at least partially liquid cooling fluid and/or for transporting a mostly vaporized fluid (steam).

In the embodiment of FIG. 5, a control device 60 is further provided. The control device 60 is adapted to activate and/or deactivate the active partial circuit. The control device 60 may, for example, open and close the first activation means 230 and/or the second activation means 231 by outputting a suitable control signal.

Typically, when an activated state of the active partial circuit 200 is intended, the control device 60 controls the first activation means 230 and the second activation means such that they are open. In the same manner, typically, when a deactivated state of the active partial circuit 200 is intended, the control device 60 controls the first activation means 230 and the second activation means such that they are closed.

Alternatively or additionally, when the activated state of the active partial circuit 200 is intended, the control device 60 may control the compressor 250 such that it operates. When the compressor 250 operates, it compresses and/or conveys the cooling fluid entering into its inlet in the direction of its outlet. Alternatively or additionally, when the deactivated state of the active partial circuit 200 is intended, the control device 60 may control the compressor 250 such that it ceases to operate, e. g. in a stand-by mode.

In the deactivated state of the active partial circuit 200, the heat exchanger assembly 1 typically works in a passive cooling mode. In this passive cooling mode, typically, components of the active partial circuit 200 are not operating. Thereby, energy may be saved in an advantageous manner.

In the activated state of the active partial circuit 200, the heat exchanger assembly 1 typically works in a so-called combined mode. The passive cooling circuit 100 will be combined with the active partial circuit 200 for performing a vapor compression cycle.

Particularly when a base-to-air type thermosiphon 101 is used as the passive cooling circuit, in the activated state of the active partial circuit 200, a forced stream of air (a forced convection stream) of the passive cooling circuit 100 may be shut-down. Alternatively, the forced stream of air may be re-directed to the active partial circuit 200, in particular to the auxiliary condenser 220 of the active partial circuit 200.

Particularly when an air-to-air type thermosiphon 101 is used as the passive cooling circuit, in the activated state of the active partial circuit 200, a forced stream of air (a forced convection stream) of the passive cooling circuit 100 may be re-directed to the active partial circuit 200, in particular to the auxiliary condenser 220 of the active partial circuit 200. Alternatively, in the activated state of the active partial circuit 200, a forced stream of air of the passive cooling circuit 100 may only be shut down in the area of the condenser 120, while the forced stream of air will be further present in the area of the evaporator 110. Alternatively, in the activated state of the active partial circuit 200, the condenser 120 serves as an additional evaporating area of the thermosiphon 101.

In some embodiments, a ventilation device such as a fan is employed for ensuring the forced stream of air (the forced convection stream) of any type of the passive cooling circuits 100 disclosed herein. Typically, the operation of the ventilation device is controlled, e. g. by the control device 60, in accordance with the activation/deactivation state of the active partial circuit.

Figure 6:
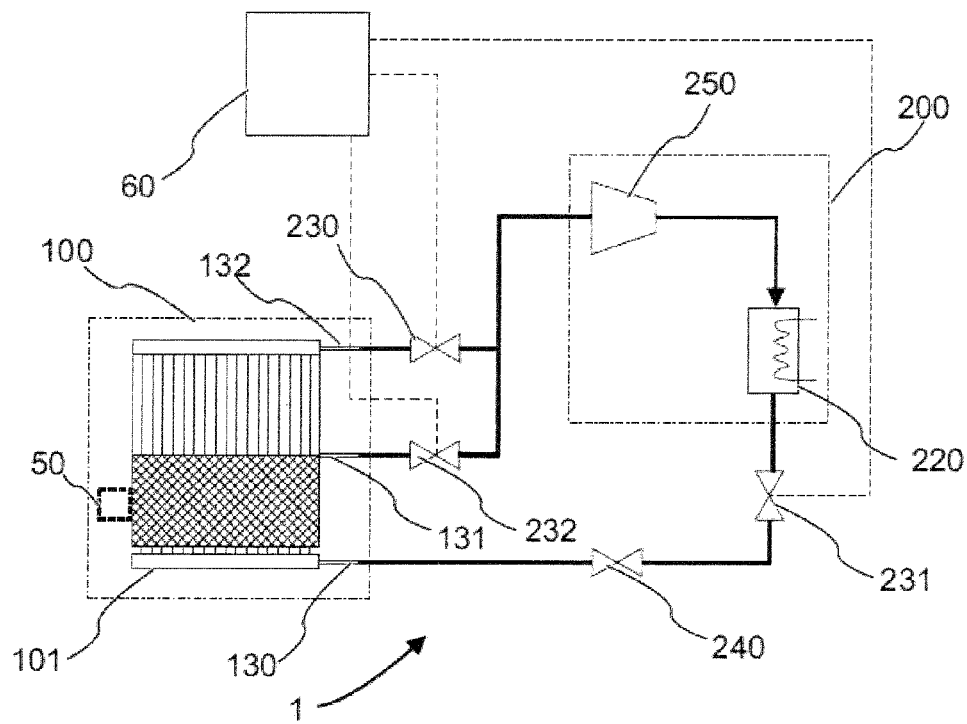
FIG. 6 shows a block diagram of a heat exchanger assembly according to a further embodiment of the present disclosure.

FIG. 6 shows a block diagram of a heat exchanger assembly according to a further embodiment of the present disclosure. The embodiment in FIG. 6 is mostly the same as the one shown in FIG. 5. Therefore, the description of same or corresponding parts is omitted here in order to avoid repetitions. Certain aspects of the embodiment of FIG. 6 may be combined with those of the embodiment of FIG. 5.

Yet, in FIG. 6, the passive cooling circuit 100 comprises a base-to-air thermosiphon 101 with an inlet 130, a condenser outlet 131 and an evaporator outlet 132. While the condenser outlet 131 is connected to the first activation means 230, the evaporator outlet 132 is connected to a third activation means 232. Both the output of the first activation means 230 and the output of the third activation means 232 are connected to the input of the active partial circuit 200.

As the first and second activation means 230, 231, also the third activation means is controllable such that a fluid path between its inlet and its outlet is opened or closed according to a control input. For example, the third activation means 232 is at least one of a mechanically operable valve, an electrically operable valve, and a thermally operable valve such as a thermostatic valve. Typically, an electrically operable valve, such as a electro-mechanical valve, is used as the third activation means 232 in a control process for operating the heat exchanger assembly.

In the embodiment of FIG. 6, the control device 60 may operate such that one of the first activation means 230 and the third activation means 232 is open during an activated state of the active cooling circuit 200, while the respective other one of the first activation means 230 and the third activation means 232 is closed. Thereby, the control device 60 may switch between a coolant connection from the condenser 12) to the active partial circuit 200 and a coolant connection from an area of the evaporator 110 to the active partial circuit 200. Of course, during the activated state, the second activation means 231 is operated such that it is open.

In the embodiment of FIG. 6, when the active partial circuit is in the deactivated state, the control device operates both the first activation means 230 and the third activation means 232 such that they are closed, alternatively or in addition to closing the second activation means 231.

Typically, when the third activation means 232 is controlled to be open and the first activation means 230 is controlled to be closed in the activated state of the active partial circuit 200, at least parts of the evaporator 110 of the base-to-air thermosiphon 101 are used alone for circulating the cooling fluid in the combined circle.

Typically, when the third activation means 232 is controlled to be closed and the first activation means 230) is controlled to be open in the activated state of the active partial circuit 200, the evaporator 110 and the condenser 120 of the base-to-air thermosiphon 101 are used together for circulating the cooling fluid in the combined circle.

Figure 7:
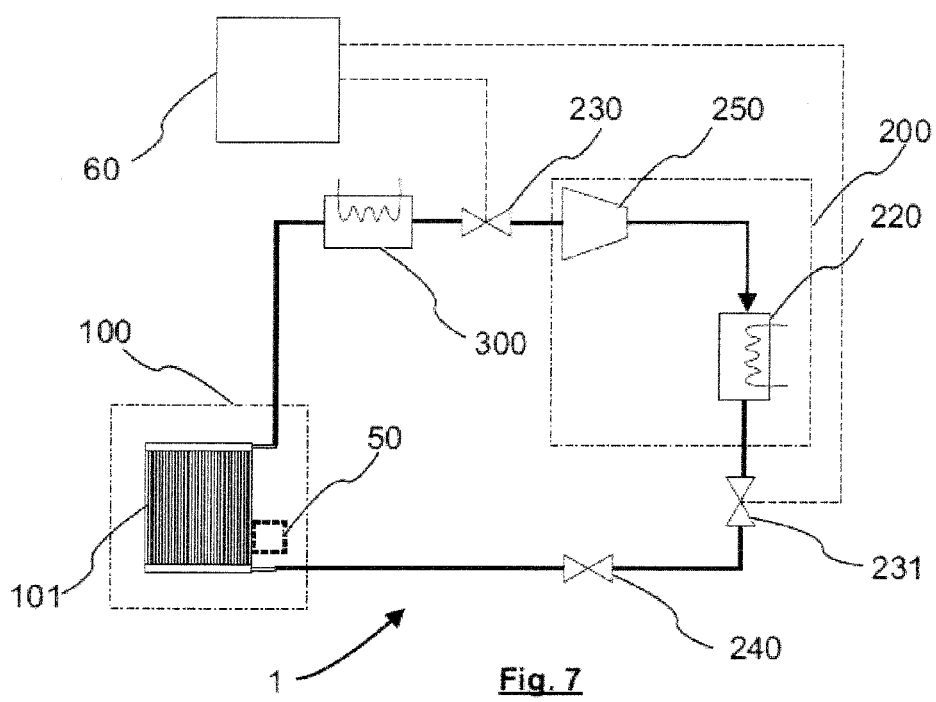
FIG. 7 shows a block diagram of a heat exchanger assembly according to yet a further embodiment of the present disclosure.

FIG. 7 shows a block diagram of a heat exchanger assembly according to yet a further embodiment. The embodiment in FIG. 7 is mostly the same as the one shown in FIG. 5. Therefore, the description of same or corresponding parts is omitted here in order to avoid repetitions. Certain aspects of the embodiment of FIG. 7 may be combined with those of the embodiment of FIG. 5. Furthermore, certain aspects of the embodiment of FIG. 7 may be combined with those of the embodiment of FIG. 6.

According to the embodiment, a superheater 300 is connected in between the output of the passive cooling circuit 100 and the active partial circuit 200. As an example and not by way of limitation, the superheater of FIG. 7 is connected in between the thermosiphon 101 and the first activation means 230.

The superheater 300 is adapted to bring a two-phase mixture at its inlet port, i. e. a mixture of cooling fluid in its liquid state and cooling fluid in its vapor state, to full vapor conditions prior to entering the active partial circuit 200.

In some embodiments, an electrical component (not shown) may be present which dissipates heat at a higher temperature than the device 50 to be cooled. The electrical component may, for example, be a secondary device besides the (main) device 50 to be cooled. According to some embodiments, the superheater 300 may be comprised by the secondary device, e. g. be part of the secondary device. Then, the secondary device, which operates at a higher temperature than the device 50 to be cooled, may take over the function of the superheater 300 while being cooled at the same time.

In some or all of the embodiments described herein, the control device 60 may be capable of controlling the activation means 230, 231, 232 such that the active partial circuit 200 is switched to the activated state for a compression cycle cooling mode, and such that the active partial circuit 200 is switched to the deactivated state for a passive cooling mode, according to an operating condition of the heat exchanger assembly 1.

Typically, the operating condition is one or more of the group of: Ambient temperature of the heat exchanger assembly 1; requested cooling capacity of the heat exchanger assembly 1; energy constraint for driving the heat exchanger assembly; and device temperature of the device 50 to be cooled.

For example, when the operating condition comprises an ambient temperature of the heat exchanger assembly 1, the active partial circuit 200 is controlled to be activated once a first threshold ambient temperature is exceeded, and/or the active partial circuit 200 is controlled to be deactivated once the ambient temperature falls below a second threshold ambient temperature.

For example and not for limitation, the first threshold ambient temperature and/or the second threshold ambient temperature are typically in the range of 30° C. to 80° C., preferably in the range of 35° C. to 60° C., most preferably in the range of 40° C. to 50° C. The first threshold ambient temperature and the second threshold ambient temperature may be equal, or the second threshold ambient temperature may be lower than the first threshold ambient temperature, for example, but not limited to, 1° C. or 2° C. or 5° C., in order to avoid an oscillation of the control.

An operating condition comprising the ambient temperature may prevent a de-rating or a malfunction of the passive cooling circuit 100. Typically, when the active partial circuit 200 is activated according to an operating condition comprising the ambient temperature, a de-rating or a malfunction of the passive cooling circuit 100 can be avoided at least up to a maximum ambient temperature, the maximum ambient temperature being higher than a reference temperature (a design temperature) of the passive cooling circuit 100. For example, and not for limitation, the reference temperature of the passive cooling circuit 100 may be in the range of 40° C. to 45° C. or in the range of 45° C. to 50° C., while the maximum ambient temperature may be in the range of 50° C. to 60° C. or in the range of 60° C. to 80° C.

When the operating condition comprises a requested cooling capacity of the heat exchanger assembly, the active partial circuit 200 is controlled to be activated once a first threshold requested cooling capacity is exceeded, and/or the active partial circuit 200 is controlled to be deactivated once the requested cooling capacity falls below a second threshold requested cooling capacity.

The requested cooling capacities may, for example, be determined by performing a temperature measurement on one or more device(s) 50 to be cooled, and by determining from the measured temperature, whether or not the cooling operation of the device(s) 50 to be cooled is sufficient. If the cooling operation does not suffice, e. g. due to a device temperature rising above a certain further threshold value, the active partial circuit 200 is controlled to be activated, and a compression cycle cooling mode (a combined mode) is performed in order to increase the cooling performance.

Additionally or alternatively, the requested cooling capacity may be risen if a fast cooldown is needed. Then, the active partial circuit 200 may be activated, typically temporarily activated, to enable the fast cooldown.

The first threshold requested cooling capacity and the second threshold requested cooling capacity may be equal, or the second threshold requested cooling capacity may be lower than the first threshold requested cooling capacity.

When the operating condition comprises an energy constraint of the heat exchanger assembly, the active partial circuit 200 is controlled to be deactivated once a first energy limit is exceeded, and/or the active partial circuit 200 is controlled to be activated once the energy required for driving the active partial circuit 200 falls below a second energy limit.

The first and/or the second energy limit may, for example, be predetermined values, or they may be determined by evaluating a selection signal from, e. g., a power grid or the like. For example, when the heat exchanger assembly 1 is operated at a remote location with a limited amount of energy available for driving the active partial circuit 200, the active partial circuit 200 is controlled to be de-activated if the energy required for driving the active partial circuit 200 exceeds the first energy limit. The first energy limit is, for example, a variable value which is adjusted according to the availably energy capacity, e. g. an available (a remaining) battery capacity.

Typically, if an energy saving situation occurs, such as a power supply (e. g. a battery or a solar battery) running low, the active partial circuit 200 may be deactivated in order to save energy.

Further, when the operating condition comprises a device temperature of the device 50 to be cooled, the active partial circuit 200 is controlled to be activated once a first threshold device temperature is exceeded, and/or the active partial circuit 200 is controlled to be deactivated once the device temperature falls below a second threshold device temperature.

For example and not for limitation, the first threshold device temperature and/or the second threshold device temperature are typically in the range of 60° C. to 150° C., preferably in the range of 80° C. to 120° C., most preferably at about 90° C. The first threshold device temperature and the second threshold device temperature may be equal, or the second threshold device temperature may be lower than the first threshold device temperature, for example, but not limited to, 1° C. or 2° C. or 5° C., in order to avoid an oscillation of the control.

An operating condition comprising the device temperature may prevent a malfunction of the device 50 to be cooled.

In some embodiments, the heat exchanger capacity 1 comprises two or more passive cooling circuits 100. The active partial circuit 200 is adapted to selectively operate with any one of the passive cooling circuits 100. Alternatively, the active partial circuit 200 is adapted to selectively operate with a plurality of the passive cooling circuits 100, typically to operate with two or more of the passive cooling circuits 100 concurrently or in an alternating manner. Typically, the active partial circuit 200 is adapted to selectively operate with all of the passive cooling circuits 100 concurrently.

In some embodiments, a heat exchanger assembly 1 as described herein is used in cooling an electrical component. The electrical component is typically one or more of a power electronic component 51, an electrical cabinet, an electrical or electronic device. For example, a power electronic component 51, for the cooling of which a heat exchanger assembly 1 as disclosed herein is used, is a power MOSFET or a power IGBT or a power IGCT, but the disclosure is not limited to these examples.

In some embodiments, a power electronic unit is provided, wherein the power electronic unit comprises at least one power electronic component 51 and a heat exchanger assembly 1 as disclosed herein. The heat exchanger assembly 1 serves for cooling the at least one power electronic component 51. Again, the power electronic component is power MOSFET or a power IGBT or a power IGCT, but the disclosure is not limited to these examples.

In typical embodiments, the at least one power electronic component 51 serves as the device 50 to be cooled as described herein.

Typically, in a power electronic unit, a plurality of power electronic components 51 is present. FIG. 8 shows a schematic side view of such a plurality of power electronic components 51 in a power electronic unit. In some embodiments, in a power electronic unit, a plurality of power electronic components 51 is stacked with a plurality of passive cooling circuits 100. As used herein, "plurality" means at least two. In the example of FIG. 8, by way of example, three power electronic components 51 are sandwiched in between a total of four passive cooling circuits, such that all of the power electronic components 51 are cooled from at least two side surfaces. A stacking of a plurality of power electronic components 51 in alternation with a plurality of passive cooling circuits 100 may allow for efficient cooling of the power electronic components 51.

The stacking sequence of the power electronic components 51 (or semiconductors S) and the passive cooling circuits 100 (or coolers C) shown in FIG. 8 is CSCSCSC. However, the stacking sequence is not limited to this example in a stacked power electronic unit. For example, the stacking sequence may be such that some or all power electronic components 51 are only cooled from one side, such as a stacking sequence of CSSCCSSC, or such that each of the power electronic components 51 is cooled from two sides by a passive cooling circuit 100 which it does not share with other power electronic components, such as a stacking sequence of CSCCSC. Moreover, any of the above stacking sequence(s) may be used in combination with other stacking sequences and/or may be repeated in a stack.

In some embodiments, the stacking of a plurality of power electronic components 51 in alternation with a plurality of passive cooling circuits 100 comprises interposing an insulating element in between parts of the stack. For example, an insulating element such as an insulating sheet may be interposed in between adjacent power electronic components 51 in the stack.

In some or all of the embodiments, typically, the passive cooling circuit 100 is dimensioned such that a convection boiling of the cooling fluid occurs at least in parts of the passive cooling circuit. Particularly, the dimensioning is such that a convection boiling occurs in the at least in the evaporator 110 of the passive cooling circuit 100, e. g. in an evaporator channel of a thermosiphon 101. Convection boiling is to be distinguished from pool boiling, as described in the following.

FIG. 9 schematically shows a convection boiling situation in a part of the evaporator 110 of a passive cooling circuit 100. In convection boiling, heat is taken away from a surface 420, typically a wall surface or the like of an evaporator channel of the evaporator 110. Here, heat is taken away from the surface 420 by conduction through a film of liquid refrigerant 432 at the surface 420 for convection boiling. The liquid refrigerant 432 is for example constituted by a part of the cooling fluid, and it is led though the evaporator channel having a confined width for preventing pool boiling. A stream of vaporized cooling fluid 433 flows in the middle part of the evaporator channel. The flow direction of the liquid refrigerant 432 and of the vaporized cooling fluid 433 is indicated by arrows. The stream may be in vapor form substantially in its entirety, i. e. in the stream 433, substantially no liquid refrigerant 432 is present. Hence, in the convection boiling situation shown in FIG. 9, a film of liquid cooling medium 432 at the surface of the channel and a stream of vaporized cooling medium 432 in the middle part of the channel is shown. Pumping or bubble pumping may increase the velocity of the vapor stream within the evaporator channel.

FIG. 10 schematically shows a pool boiling situation for comparison. Here, heat is taken away from the surface 420 by continuously nucleating bubbles of vapor 433 that slowly hover off the wall surface for gravity reasons. In pool boiling, the bubbles are present in the liquid refrigerant 432.

The thermal efficiency is higher with convection boiling than with pool boiling, because the velocity of the vapor stream and the vapor quality is higher than in pool boiling situations.

Since in pool boiling, the vapor bubble speed is comparatively low, a vapor bubble needs a comparatively long time to reach its destination, e. g. a refrigerant surface level. Thus, a fair portion of the thermal energy is needed for heating the environing liquid refrigerant up.

On the other hand, in convection boiling, because of the comparatively high velocity of the vapor stream and the comparatively higher vapor quality, the heat is removed comparatively quickly from the area where the vaporization took place. Thus, the liquid refrigerant neighboring the vapor stream is not heated up as much as in pool boiling situations. As a result, the thermal energy content of the vapor in convection boiling situations is higher than in pool boiling situations, and the thermal efficiency is higher.

Although the invention has been described on the basis of some preferred embodiments, those skilled in the art should appreciate that those embodiments should by no way limit the scope of the present invention. Without departing from the spirit and concept of the present invention, any variations and modifications to the embodiments should be within the apprehension of those with ordinary knowledge and skills in the art, and therefore fall in the scope of the present invention which is defined by the accompanied claims.

LIST OF REFERENCE NUMERALS 1 heat exchanger assembly
10 power curve
20 temperature curve
50 device to be cooled
51 power electronic component
60 control device
100 passive cooling circuit
110 evaporator
120 condenser
130 inlet
131 condenser outlet
132 evaporator outlet
200 active partial circuit
220 auxiliary condenser
230, 231, 232 activation means
240 expansion valve
250 compressor
300 superheater
420 surface
432 liquid cooling fluid
433 vaporized cooling fluid

The invention claimed is:

1. A heat exchanger assembly, comprising: at least one passive cooling circuit, the passive cooling circuit comprising an evaporator connectable to a device to be cooled for conducting heat from the device to be cooled to the cooling fluid within the evaporator, thereby evaporating the cooling fluid, and a condenser interconnected with the evaporator for receiving the evaporated cooling fluid from the evaporator, releasing heat from the cooling fluid to an environment of the condenser, thereby condensing from the cooling fluid, and for returning the condensed cooling fluid to the evaporator; an active partial circuit comprising a compressor and an auxiliary condenser, the active partial circuit being activatable and deactivatable and being connected to the passive cooling circuit for receiving, in an activated state of the active partial circuit, the cooling fluid from the evaporator, for compressing the received cooling fluid by the compressor, for releasing heat, by the auxiliary condenser, from the compressed cooling fluid to an environment of the auxiliary condenser, and for returning the condensed cooling fluid to the evaporator, wherein the passive cooling circuit is a base-to-air type thermosiphon or an air-to-air type thermosiphon devoid of a compressor, wherein in a deactivated state of the active partial circuit, the passive cooling circuit is configured to operate in a standalone manner, and components of the active partial circuit are not operating wherein, in the activated state of the partial circuit, the passive cooling circuit is combined with the active partial circuit for performing a vapor compression cycle.

2. The heat exchanger assembly according to claim 1, wherein the passive cooling circuit comprises a coolant connection from the condenser to the active partial circuit, or
wherein the passive cooling circuit comprises a coolant connection from an area of the evaporator to the active partial circuit, particularly from an upstream area of the evaporator to the active partial circuit.

3. The heat exchanger assembly according to claim 1, further comprising a controllable activation means for selectively switching the active partial circuit between the activated state and the deactivated state.

4. The heat exchanger assembly according to claim 3, wherein the activation means comprises at least one of a mechanically operable valve, an electrically operable valve, and a thermally operable valve.

5. The heat exchanger assembly according to claim 3, wherein the heat exchanger assembly further comprises a control device capable of controlling the activation means such that the active partial circuit is switched to activated state for a compression cycle cooling mode, and such that the active partial circuit is switched to the deactivated state for a passive cooling mode, according to an operating condition of the heat exchanger assembly.

6. The heat exchanger assembly according to claim 5, wherein the operating condition is the ambient temperature of the heat exchanger assembly, and/or
wherein the operating condition is a requested cooling capacity of the heat exchanger assembly, and/or
wherein the operating condition is an energy constraint for driving the heat exchanger assembly, and/or
wherein the operating condition is a device temperature of the device to be cooled.

7. The heat exchanger assembly according to claim 1, further comprising a superheater between the passive cooling circuit and the active partial circuit.

8. The heat exchanger assembly according to claim 1, comprising two or more passive cooling circuits, the active partial circuit being adapted to selectively operate with any one of the passive cooling circuits or a plurality thereof.

9. A power electronic unit comprising at least one power electronic component and at least one heat exchanger assembly according to claim 1 for cooling the at least one power electronic component.

10. The power electronic unit of claim 9, wherein a plurality of passive cooling circuits are stacked with a plurality of power electronic components.

11. The heat exchanger assembly according to claim 2, further comprising a controllable activation means for selectively switching the active partial circuit between the activated state and the deactivated state.

12. The heat exchanger assembly according to claim 11, wherein the activation means comprises at least one of a mechanically operable valve, an electrically operable valve, and a thermally operable valve.

13. The heat exchanger assembly according to claim 4, wherein the heat exchanger assembly further comprises a control device capable of controlling the activation means such that the active partial circuit is switched to activated state for a compression cycle cooling mode, and such that the active partial circuit is switched to the deactivated state for a passive cooling mode, according to an operating condition of the heat exchanger assembly.

14. The heat exchanger assembly according to claim 11, wherein the heat exchanger assembly further comprises a control device capable of controlling the activation means such that the active partial circuit is switched to activated state for a compression cycle cooling mode, and such that the active partial circuit is switched to the deactivated state for a passive cooling mode, according to an operating condition of the heat exchanger assembly.

15. The heat exchanger assembly according to claim 2, further comprising a superheater between the passive cooling circuit and the active partial circuit.

16. The heat exchanger assembly to claim 3, further comprising a superheater between the passive cooling circuit and the active partial circuit.

17. The heat exchanger assembly according to claim 4, further comprising a superheater between the passive cooling circuit and the active partial circuit.

18. The heat exchanger assembly according to claim 5, further comprising a superheater between the passive cooling circuit and the active partial circuit.

19. The heat exchanger assembly according to claim 6, further comprising a superheater between the passive cooling circuit and the active partial circuit.

20. The power electronic unit of claim 10, wherein the plurality of passive cooling circuits are stacked in alternation with the plurality of power electronic components.

21. A method for operating a heat exchanger assembly, the heat exchanger assembly comprising at least one passive cooling circuit, the passive cooling circuit comprising an evaporator connectable to a device to be cooled for conducting heat from the device to be cooled to the cooling fluid within the evaporator, thereby evaporating the cooling fluid, and a condenser interconnected with the evaporator for receiving the evaporated cooling fluid from the evaporator, releasing heat from the cooling fluid to an environment of the condenser, thereby condensing the cooling fluid, and for returning the condensed cooling fluid to the evaporator; and an active partial circuit comprising a compressor and an auxiliary condenser, the active partial circuit being activatable and deactivatable and being connected to the passive cooling circuit for receiving, in an activated state of the active partial circuit, the cooling fluid from the evaporator, for compressing the received cooling fluid by the compressor, for releasing heat, by the auxiliary condenser, from the compressed cooling fluid to an environment of the auxiliary condenser, and for returning the condensed cooling fluid to the evaporator, wherein the passive cooling circuit is a base-to-air thermosiphon or an air-to-air type thermosiphon devoid of a compressor, the method comprising: according to an operating condition of the heat exchanger assembly, deactivating the active partial circuit such that the heat exchanger assembly operates in a passive cooling mode, in which the heat exchanger assembly performs passive cooling by the evaporator and the condenser of the passive cooling device in a standalone manner, and in which components of the active partial circuit are not opening; and according to the operating condition of the heat exchanger assembly, activating the active partial circuit such that it operates in a compression cycle cooling mode, in which the heat exchanger assembly performs a forced convection by the evaporator of the passive cooling circuit, the auxiliary condenser of the active partial circuit and the compressor of the active partial circuit, wherein in the activated state of the partial circuit the passive cooling circuit is combined with the active partial circuit for performing a vapor compression cycle.

* * * * *